United States Patent
Shabani et al.

(10) Patent No.: US 11,903,330 B2
(45) Date of Patent: Feb. 13, 2024

(54) TOPOLOGICAL QUBIT ARCHITECTURE BASED ON JOSEPHSON JUNCTION FABRICATED ON TWO-DIMENSIONAL ELECTRON GASES

(71) Applicant: NEW YORK UNIVERSITY, New York, NY (US)

(72) Inventors: Javad Shabani, Briarcliff Manor, NY (US); Matthieu C. Dartiailh, New York, NY (US)

(73) Assignee: NEW YORK UNIVERSITY, New York, NY (US)

( * ) Notice: Subject to any disclaimer, the term of this patent is extended or adjusted under 35 U.S.C. 154(b) by 116 days.

(21) Appl. No.: 17/378,375

(22) Filed: Jul. 16, 2021

(65) Prior Publication Data
US 2022/0020914 A1   Jan. 20, 2022

Related U.S. Application Data

(60) Provisional application No. 63/053,514, filed on Jul. 17, 2020.

(51) Int. Cl.
*H10N 60/12* (2023.01)
*G06N 10/40* (2022.01)
*H10N 60/01* (2023.01)
*H10N 60/10* (2023.01)

(52) U.S. Cl.
CPC ............ *H10N 60/12* (2023.02); *G06N 10/40* (2022.01); *H10N 60/01* (2023.02); *H10N 60/0912* (2023.02); *H10N 60/128* (2023.02)

(58) Field of Classification Search
CPC .... H10N 60/12; H10N 60/01; H10N 60/0912; H10N 60/128; G06N 10/40
See application file for complete search history.

(56) References Cited

U.S. PATENT DOCUMENTS 11,430,831 B2 * 8/2022 Gumann ............... G06N 10/00

OTHER PUBLICATIONS

He et al., Retracted "Chiral Majorana fermions modes in a quantum anomalous Hall insulator superconductor structure," Science 357, 294 (2017). (Year: 2017).*
Zhang, H., Liu, CX., Gazibegovic, S. et al. Retracted Article: Quantized Majorana conductance. Nature 556, 74-79 (2018). https://doi.org/10.1038/nature26142 (Year: 2018).*

(Continued)

*Primary Examiner* — Matthew L Reames
(74) *Attorney, Agent, or Firm* — Foley & Lardner, LLP

(57) ABSTRACT

The method of performing braiding operations can include providing a first Josephson junction including first gates. The method can include providing a second Josephson junction including second gates. The method can include tuning the first gates to dispose a first pair of Majorana fermions a first region. The method can include tuning the second gates to dispose a second pair of Majorana fermions in a second region. The method can include tuning the first gates to dispose a first Majorana fermion in the first region and to dispose a second Majorana fermion in a third region. The method can include tuning the second gates to dispose a third Majorana fermion in a fourth region and to dispose a fourth Majorana fermion in the second region.

9 Claims, 7 Drawing Sheets

(56) References Cited

OTHER PUBLICATIONS

Aasen, et al., "Milestones Toward Majorana-Based Quantum Computing," Physical Review X 6(3), 031016, 28 pages (2016).
Albrecht, et al., "Exponential protection of zero modes in Majorana islands," Nature 531, pp. 206-209 (2016).
Albrecht, et al., "Implementation of Clifford gates in the Ising-anyon topological quantum computer," Physical Review A 79(3), 032311, 17 pages (2009).
Alicea, et al., "Non-Abelian statistics and topological quantum information processing in 1D wire networks," Nature Physics 7, pp. 412-417 (2011).
Altland & Zirnbauer, "Nonstandard symmetry classes in mesoscopic normal-superconducting hybrid structures," Physical Review B 55(2), 1142, 20 pages (1997).
Bardeen, et al., "Structure of Vortex Lines in Pure Superconductors," Physical Review Journals Archive 187(2), 556 (1969).
Beenakker, "Three 'Universal' Mesoscopic Josephson Effects," Transport Phenomena in Mesoscopic Systems, pp. 235-253 (1992).
Cayao, et al., "Majorana splitting from critical currents in Josephson junctions," Physical Review B 96(20), 205425, 10 pages (2017).
Desjardins, et al., "Synthetic spin-orbit interaction for Majorana devices," Nature Materials 18, pp. 1060-1064 (2019).
Dodson, et al., "Fabrication process and failure analysis for robust quantum dots in silicon," retrieved from https://arxiv.org/abs/2004.05683, 9 pages (2020).
Fatin, et al., "Wireless Majorana Bound States: From Magnetic Tunability to Braiding," Physical Review Letters 117(7), 077002, 6 pages (2016).
Fornieri, et al., "Evidence of topological superconductivity in planar Josephson junctions," Nature 569, pp. 89-92 (2019).
Fu & Kane, "Superconducting Proximity Effect and Majorana Fermions at the Surface of a Topological Insulator," Physical Review Letters 100(9), 096407, 4 pages (2008).
Groth, et al., "Kwant: a software package for quantum transport," New Journal of Physics 16, 063065, 39 pages (2014).
Haim & Stern, "Benefits of Weak Disorder in One-Dimensional Topological Superconductors," Physical Review Letters 122(12), 126081, 14 pages (2019).
Hart, et al., "Controlled finite momentum pairing and spatially varying order parameter in proximitized HgTe quantum wells," Nature Physics 13, pp. 87-93 (2017).
Hell, et al., "Two-Dimensional Platform for Networks of Majorana Bound States," Physical Review Letters 118(10), 107701, 13 pages (2017).
Ke, et al., "Ballistic superconductivity and tunable p-junctions in InSb quantum wells," Nature Communications 10, 3764, 6 pages (2019).
Kitaev, "Unpaired Majorana fermions in quantum wires," Physics-Uspekhi 44, pp. 131-136(2001).
Klinovaja & Loss, "Time-reversal invariant parafermions in interacting Rashba nanowires," Physical Review B 90(4), 045118, 9 pages (2014).
Kontos, et al., "Josephson Junction through a Thin Ferromagnetic Layer: Negative Coupling," Physical Review Letters 89(13), 137007, 4 pages (2002).
Laeven, et al., "Enhanced proximity effect in zigzag-shaped Majorana Josephson junctions," retrieved from https://arxiv.org/abs/1903.06168, 5 pages (2019).
Lutchyn, et al., "Majorana Fermions and a Topological Phase Transition in Semiconductor-Superconductor Heterostructures," Physical Review Letters 105(7), 077001, 5 pages (2010).
Matos-Abiague, et al., "Tunable magnetic textures: From Majorana bound states to braiding," Solid State Communications 262, pp. 1-6 (2017).
Mayer, et al., "Gate controlled anomalous phase shift in Al/InAs Josephson junctions," Nature Communications 11, 212, 6 pages (2020).
Mayer, et al., "Phase signature of topological transition in Josephson Junctions," retrieved from https://arxiv.org/abs/1906.01179, 11 pages (2019).
Mayer, et al., "Superconducting proximity effect in epitaxial Al-InAs heterostructures," Applied Physics Letters 114(10), 103104, 5 pages (2019).
Mourik, et al., "Signatures of Majorana Fermions in Hybrid Superconductor-Semiconductor Nanowire Devices," Science 336(6084), pp. 1003-1007 (2012).
Murani, et al., "Ballistic edge states in Bismuth nanowires revealed by SQUID interferometry," Nature Communications 8, 15941, 7 pages (2017).
Nadj-Perge, et al., "Observation of Majorana fermions in ferromagnetic atomic chains on a superconductor," Science 346(6209), pp. 602-607 (2014).
Nayak, et al., "Non-Abelian anyons and topological quantum computation," Reviews of Modern Physics 80(3), 1083, 73 pages (2008).
Oreg, et al., "Helical Liquids and Majorana Bound States in Quantum Wires," Physical Review Letters 105(17), 177002, 4 pages (2010).
Pientka, et al., "Topological Superconductivity in a Planar Josephson Junction," Physical Review X 7(2), 021032, 17 pages (2017).
Ren, et al., "Topological superconductivity in a phase-controlled Josephson junction," Nature 569, pp. 93-98 (2019).
Rokhinson, et al., "The fractional a.c. Josephson effect in a semiconductor-superconductor nanowire as a signature of Majorana particles," Nature Physics 8, pp. 795-799 (2012).
San-Jose, et al., "ac Josephson Effect in Finite-Length Nanowire Junctions with Majorana Modes," Physical Review Letters 109(25), 257001, 5 pages (2012).
Scharf, et al., "Tuning topological superconductivity in phase-controlled Josephson junctions with Rashba and Dresselhaus spin-orbit coupling," Physical Review B 99(21), 214503, 21 pages (2019).
Sengupta, et al., "Midgap edge states and pairing symmetry of quasi-one-dimensional organic superconductors," Physical Review B 63(14), 144531, 6 pages (2001).
Setiawan, et al., "Full proximity treatment of topological superconductors in Josephson-junction architectures," Physical Review B 99(17), 174511, 19 pages (2019).
Shabani, et al., "Two-dimensional epitaxial superconductor-semiconductor heterostructures: A platform for topological superconducting networks," Physical Review B 93(15), 155402, 13 pages (2016).
Suominen, et al., "Anomalous Fraunhofer interference in epitaxial superconductor-semiconductor Josephson junctions," Physical Review B 95(4), 035307, 26 pages (2017).
Tsuei & Kirtley, "Pairing symmetry in cuprate superconductors," Reviews of Modern Physics 72(4), pp. 969-1016 (2000).
Wickramasinghe, et al., "Transport properties of near surface InAs two-dimensional heterostructures featured," Applied Physics Letters 113(26), 262104, 5 pages (2018).
Yazdani, "Conjuring Majorana with synthetic magnetism," Nature Materials 18, pp. 1036-1037 (2019).
Yokoyama, et al., "Anomalous Josephson effect induced by spin-orbit interaction and Zeeman effect in semiconductor nanowires," Physical Review B 89(19), 195407, 14 pages (2014).
Zhou, et al., "Phase Control of Majorana Bound States in a Topological X Junction," Physical Review Letters 124(13), 137001, 6 pages (2020).
Zutic & Das Sarma, et al., "Spin-polarized transport and Andreev reflection in semiconductor/superconductor hybrid structures," Physical Review B 60(24), R16322, 6 pages (1999).

* cited by examiner

FIG. 7E
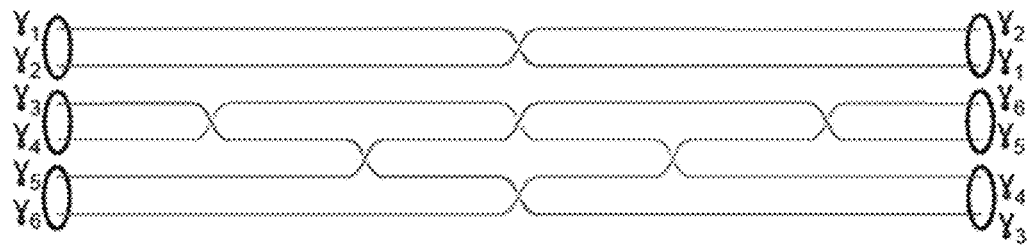
FIG. 8A
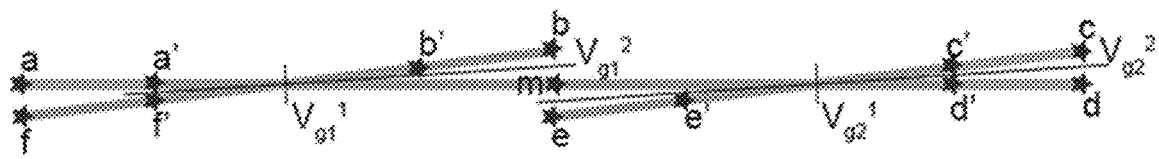
FIG. 8B
FIG. 9

TOPOLOGICAL QUBIT ARCHITECTURE BASED ON JOSEPHSON JUNCTION FABRICATED ON TWO-DIMENSIONAL ELECTRON GASES

CROSS-REFERENCE TO RELATED APPLICATIONS

This application claims priority to and the benefit of U.S. Provisional Patent Application No. 63/053,514, filed Jul. 17, 2020, the content of which is incorporated by reference in its entirety.

GOVERNMENT RIGHTS

This invention was made with Government support under contract no. DP18AP900007 awarded by the Defense Advanced Research Projects Agency. The Government has certain rights in the invention.

TECHNICAL FIELD

The present disclosure generally relates to the field of quantum computing.

BACKGROUND

In the field of quantum computing, superconducting quantum bits (qubits) form the basic unit of quantum information. Qubits can be formed of superconductor-insulator materials to produce a Josephson junction (JJ). Junctions with semiconductors as the weak-link resemble classical field-effect transistors and can be tuned via a gate voltage applied to the semiconductor. A hurdle in the performance of qubit systems is the constraints on quantum error correction.

SUMMARY

Majorana based quantum computing can alleviate constraints on quantum error correction by providing hardware intrinsically resilient to local errors. The systems and methods of the present disclosure can include a set of devices that can be used as qubits. By using top-down fabrication techniques based on large-scale molecular-beam epitaxy (MBE) growth of shallow two-dimensional electron gases (2DEG) in InAs, issues present in one-dimensional (1D) platforms (e.g., nanowires) can be circumvented. Electrostatic gating can be used to precisely control the extent of the topological regions and allow for high operation speed. Control schemes can be based on flux biasing.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE DRAWINGS

The details of one or more implementations of the subject matter described in this specification are set forth in the accompanying drawings and the description below. Other features, aspects, and advantages of the subject matter will become apparent from the description, the drawings, and the claims.

FIGS. 7A-7E illustrate an extensible design allowing for arbitrary braids, according to an embodiment.

FIGS. 8A-8B illustrate a demonstration of a CNOT (controlled NOT) gate on two qubits, according to an embodiment.

FIG. 9 illustrates a table of locations of the Majorana fermions as a function of time and state of the splitter gates, according to an embodiment.

Like reference numbers and designations in the various drawings indicate like elements.

DETAILED DESCRIPTION

Following below are more detailed descriptions of various concepts related to, and implementations of, methods, apparatuses, and systems for topological qubits. The various concepts introduced above and discussed in greater detail below may be implemented in any of a number of ways, as the described concepts are not limited to any particular manner of implementation. Examples of specific implementations and applications are provided primarily for illustrative purposes.

The use of systems supporting Majorana fermions can be used to realize error resilient quantum hardware for quantum information processing. The quantum hardware can be built on platforms based on semiconducting nanowires.

The non-abelian statistics of Majorana, which can provide a limited set of topologically protected gates, can be used to exchange Majorana particles while keeping them separated at all times. In the context of nanowires, this may include growing complex networks whose growth conditions may be at odds with the quality of the material. A top-down approach on a 2D platform can be used to circumvent this issue since the connectivity of the device can be determined during the fabrication process rather than during the growth. The first experimental realizations on Josephson junctions (JJ) can show the viability of this platform.

Figures 1A, 1B:
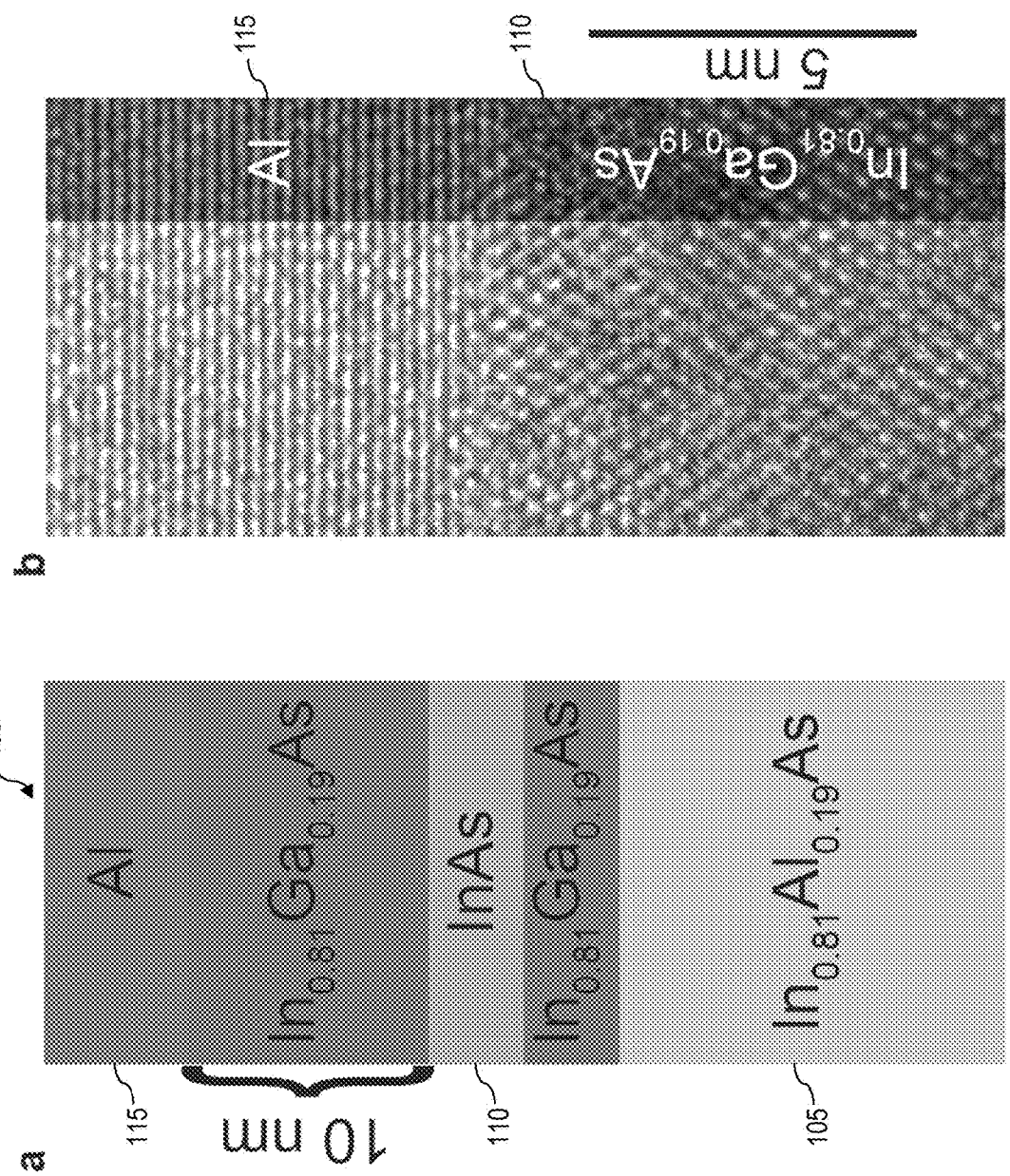
FIG. 1A illustrates a schematic diagram of a structure of a surface 2DEG using InAs as the confinement layer, according to an embodiment.
FIG. 1B illustrates a schematic diagram of a TEM image of the interface between the second semiconducting layer and the layer of Al grown on top, according to an embodiment.

Devices that can be operated as a qubit can be fabricated according the methods presented herein. For example, the fabrication process can be performed on a platform including a two-dimensional (e.g., bi-dimensional) electron gas based on InAs. FIG. 1A illustrates a schematic diagram of a structure (e.g., stack) of a surface 2DEG using InAs as the confinement layer. The surface 2DEG can include an $In_{0.81}Al_{0.19}As$ layer, a first $In_{0.81}Ga_{0.19}As$ layer, an InAs layer, a second $In_{0.81}Ga_{0.19}As$ layer, and an Al layer. The first $In_{0.81}Ga_{0.19}As$ layer can be disposed on the $In_{0.81}Al_{0.19}As$ layer. The InAs layer can be disposed on the first $In_{0.81}Ga_{0.19}As$ layer. The second $In_{0.81}Ga_{0.19}As$ layer can be disposed on the InAs layer. The Al layer can be disposed on the second $In_{0.81}Ga_{0.19}As$ layer. The fabrication process can be transposed to any platform on which the semiconducting layer can be etched to define the overall shape of the device. For example, the platform can include III-V based structures and HgTe based structures. Epitaxial superconducting layers (e.g., Al) can be grown on top of III-V semiconductors and III-V semiconductors structures.

FIG. 1B illustrates a schematic diagram of a TEM image of the interface between the second semiconducting layer (e.g., top semiconducting layer) and the layer of Al grown on top, according to an embodiment. The TEM image can illustrate the quality of the interface that can be obtained. The second semiconducting layer can include $In_{0.81}Ga_{0.19}As$.

The devices can include Josephson junctions in which two superconducting electrodes are separated by a short portion of 2DEG acting as a weak link. To obtain well defined Majorana states, this separation can be small (e.g., of the order of 100 nm or below). In the presence of a sizeable magnetic field applied in-plane and perpendicular to the direction of the current flowing though the Josephson junction, the device can enter a topological phase. A property of these structures can include the ability to control the topological phase hosting the Majorana fermions by tuning the gate voltage applied to the portion of 2DEG separating the superconducting electrodes. The topological and non-topological regions can be engineered using multiple gates. Sensor structures can be engineered by starting from a 2DEG. Sensor structures can include quantum point contacts (QPCs) and quantum dots that can be used to read out the state of the qubit.

Figure 2A:
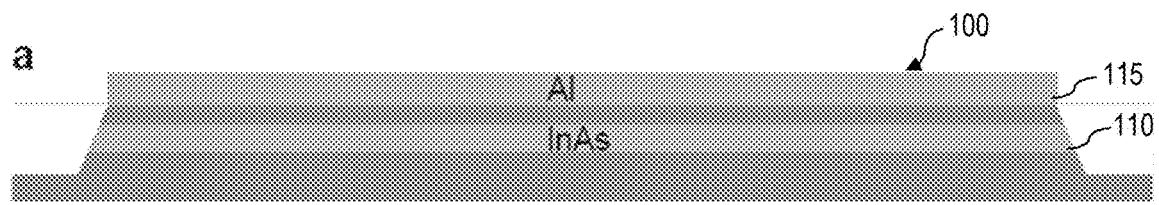
FIGS. 2A-2F illustrate a side view of fabrication steps involved in fabricating a qubit device, according to an embodiment.
Figure 2B:
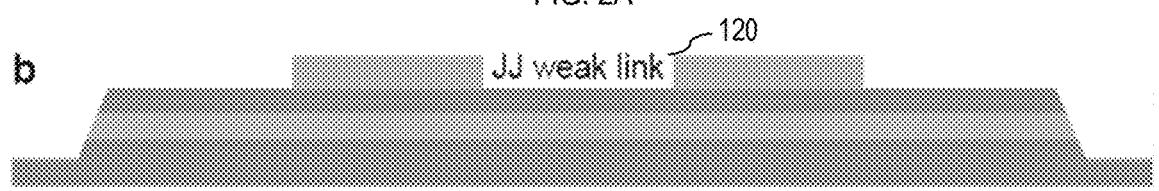
Figure 2C:
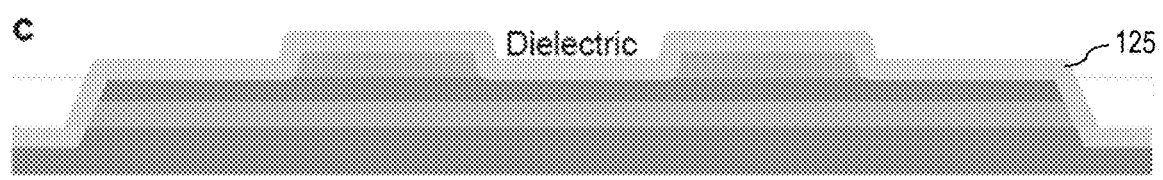
Figure 2D:
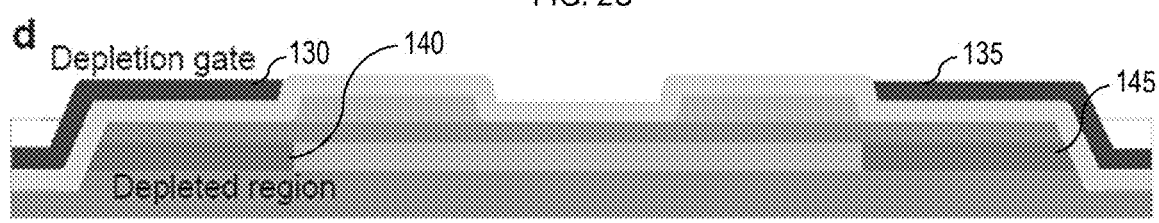
Figure 2E:
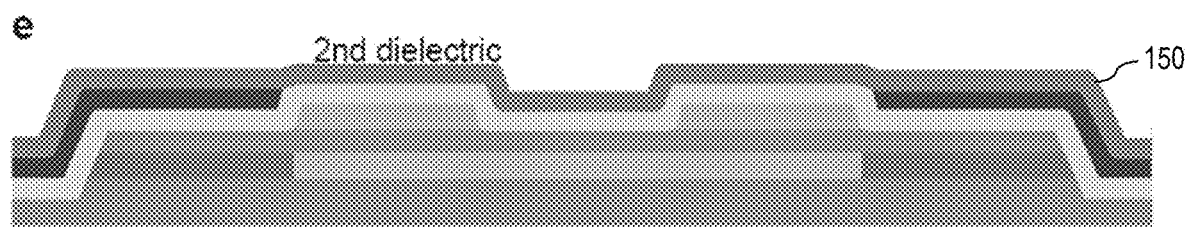
Figure 2F:
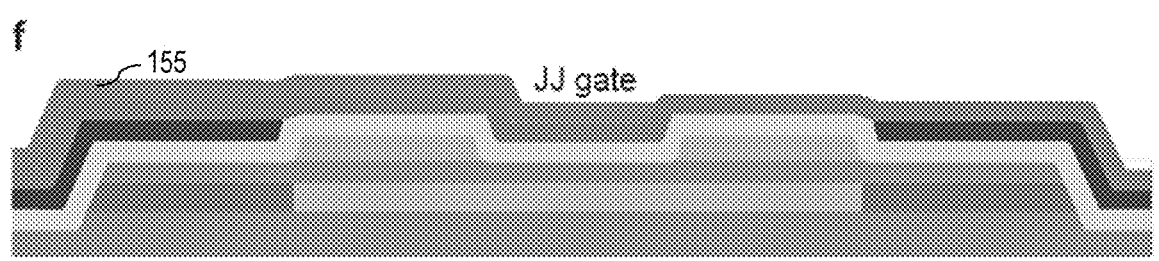

FIGS. 2A-2F illustrate a side view of fabrication steps involved in fabricating a qubit device and a side view of InAs with an epitaxial Al layer. FIG. 2A illustrates that large structures are defined in the 2DEG layer through etching. Wet etching can be used to preserve the high crystalline structure of the material. FIG. 2B illustrates that structures too fine to be defined in FIG. 2A, whose resolution can be limited to about 1 μm, are defined in the Al layer along with the weak link region of Josephson Junctions. FIG. 2C illustrates that the device is blanketed with a dielectric layer. The atomic layer deposition (ALD) of $AlO_x$ can be used. FIG. 2D illustrates the deposition of gates (e.g., gate electrodes). Gates are deposited to deplete the 2DEG behind the Al contact. FIG. 2E illustrates that a second dielectric layer is deposited to allow the deposition of a gate electrode to overlap with the depletion gate. The second dielectric layer can be avoided by using a gate electrode that can self-passivate (e.g., Al) for the depletion gate. FIG. 2E and FIG. 2F illustrate that additional gate layers can be added.

The process can be transferred to other materials and, in particular, the definition of the superconducting structure through Al etching can be translated in an equivalent metal deposition for a substrate on which epitaxial growth of the superconducting layer is not feasible. To preserve the quality of the superconductivity induced in the 2DEG by the superconducting electrode in presence of the in-plane magnetic field, the width of the contact can be limited to about 100 nm. Since available etching techniques of the 2DEG may not provide the resolution to design such narrow electrodes, a depletion gate behind the superconducting electrodes of the Josephson junction can be used. Overlapping gates isolated either by additional dielectric layers or by oxidizing the existing gates in a controlled manner can be used to route the gates to control the weak link of the Josephson junction.

The fabrication method can include providing a stack 100. The stack 100 can include a substrate 105, a two-dimensional electron gas layer 110 (e.g., confinement layer) disposed on the substrate 105, and a superconducting layer 115 disposed on the two-dimensional electron gas layer 110. The substrate 105 can include III-V semiconductors and/or III-V semiconductors structures. The two-dimensional electron gas layer 110 can include InAs.

The method can include etching the stack 100. Etching the stack 100 can include wet etching the stack 100. Wet etching can be used to preserve the high crystalline structure of the material. The method can include removing a portion of the superconducting layer to form a weak link region 120.

The method can include depositing a first dielectric layer 125 on the stack 100. The first dielectric layer 125 can be deposited via atomic layer deposition. The method can include depositing a first gate electrode 130 on a first portion of the first dielectric layer. The first gate electrode 130 can be deposited via atomic layer deposition. The first gate electrode 130 can be configured to deplete charge carriers from a first portion of the two-dimensional electron gas layer 140.

The method can include depositing a second gate electrode 135 on a second portion of the first dielectric layer. The second gate electrode 135 can be deposited via atomic layer deposition. The second gate electrode 135 can be configured to deplete charge carriers from a second portion of the two-dimensional electron gas layer 145. The method can include depositing a second dielectric layer 150 on the stack 100. The second dielectric layer 150 can be deposited via atomic layer deposition.

The method can include depositing a third gate electrode 155 on the stack 100. The third gate electrode 155 can be deposited via atomic layer deposition. The third gate electrode 155 can be configured to overlap with the first gate electrode 130. For example, the third gate electrode 155 can partially or completely overlap the first gate electrode 130.

Figure 3A:
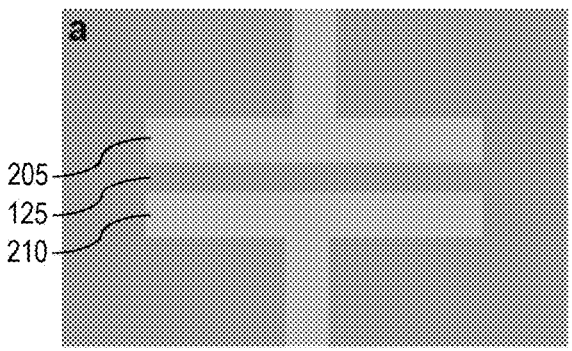
FIGS. 3A-3D illustrate a top view of fabrication steps involved in fabricating a qubit device, according to an embodiment.
Figure 3B:
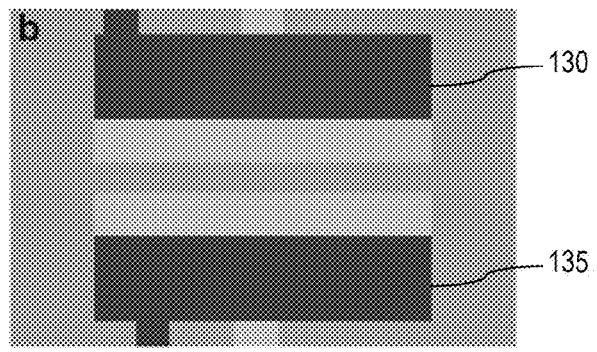
Figure 3C:
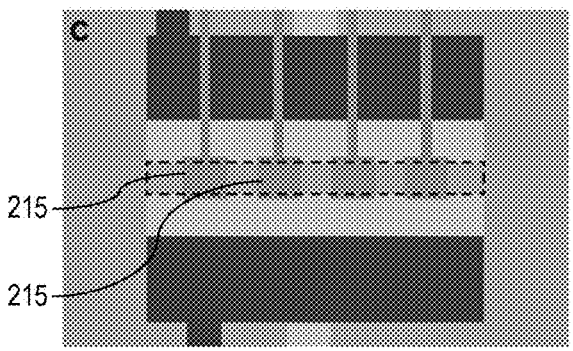
Figure 3D:
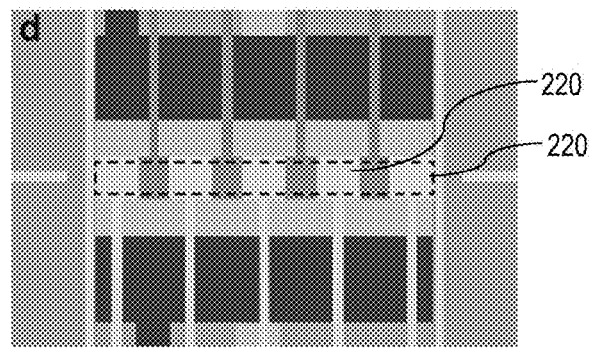

FIGS. 3A-3D illustrate a top view of fabrication steps involved in fabricating a qubit device. FIG. 3A illustrates that the overall structure of the 2DEG layer can be defined through lithography and that the superconducting electrodes can be etched or deposited. The super conducting electrodes can include a first superconducting electrode 205 and a second superconducting electrode 210. FIG. 3B illustrates that after depositing an insulating layer, the gates (e.g., confinement gates) are deposited. The gates can include a first gate electrode 130 and a second gate electrode 135. The gates are allowed to deplete the 2DEG behind (e.g., below, underneath, etc.) the superconducting electrodes. For example, the first gate electrode 130 can deplete the 2DEG behind the first superconducting electrode 205. The second gate electrode 135 can deplete the 2DEG behind the second superconducting electrode 210. FIG. 3C illustrates a first set of gates 215 (e.g., bottom set of tuning gates, first set of tuning gates) controlling the density of the 2DEG in the Josephson junction weak link. FIG. 3D illustrates that a second set of gates 220 (e.g., top set of tuning gates, second set of tuning gates, electrometers) is deposited on the weak link region partially overlapping with the first set of gates, and additional electrodes forming charge sensors are also deposited.

The weak link region 120 and the superconducting electrodes can be about 100 nanometers wide. The lateral extension of the junction can reach several microns. The layer of dielectric insulating the gates are not shown. Once the pattern of the superconducting electrode has been defined (FIG. 3A), the depletion electrodes are deposited behind the electrodes as illustrated in FIG. 3B. Gates to control the electronic density in the weak link are next deposited in two steps (FIG. 3C and FIG. 3D) to provide the ability to tune the density over the whole width of the Josephson junction. In FIG. 3D, quantum point contacts that can be used as charge sensor are also defined at each extremity of the Josephson junction. The charge sensor can be used to read the result of a fusion operation performed by tuning the gates. This device can perform non-protected operations by bringing topological regions close to one another. The decoherence of this device can be reduced due to the topological protection. Decoherence can include loss of quantum coherence.

The device can include a substrate and a two-dimensional electron gas layer. The two-dimensional electron gas layer can include a two-dimensional electron gas disposed on the substrate. The device can include the first superconducting electrode 205 and the second superconducting electrode 210 disposed on the two-dimensional electron gas layer and separated by the two-dimensional electron gas. The device can include a first confinement gate disposed on the first superconducting electrode 205 and the two-dimensional electron gas layer. The device can include a second confinement gate disposed on the second superconducting electrode 210 and the two-dimensional electron gas layer. The device can include a first set of tuning gates disposed on a weak link region between the first superconducting electrode 205 and the second superconducting electrode 210. The device can include a second set of tuning gates disposed on the weak link region and the second set of tuning gates. The weak link region can be less than 100 nanometers. The two-dimensional electron gas can include InAs.

Figure 4:
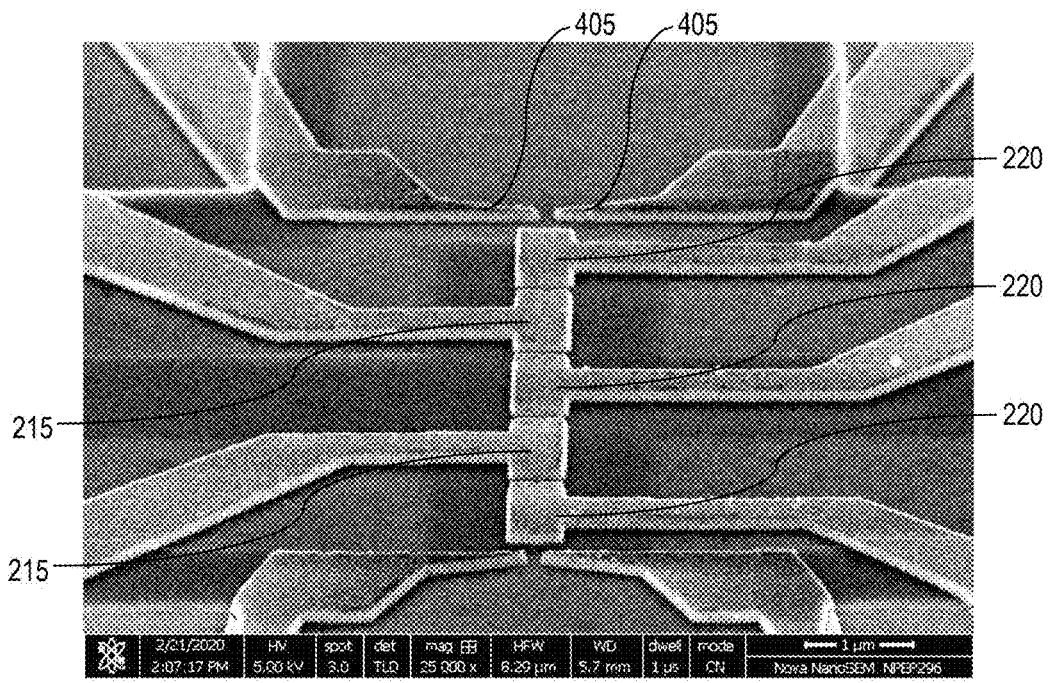
FIG. 4 illustrates an SEM image of a device with multiple gates and tunnel probes at each end of a Josephson junction, according to an embodiment.

FIG. 4 illustrates an SEM image of a device with multiple gates and tunnel probes at each end of a Josephson junction. The device includes gates on a single layer and tunnel probes 405 at each ends of the Josephson junction. These devices could be used as a stepping stone for more complex devices by providing a platform for testing properties of Majorana fermions such as their fusion rule. By replacing the tunnel probes 405 in FIG. 4 by charge sensors, fusion rules can be tested by creating pair of Majorana at each end of the device and then fusing one Majorana of each pair in the middle, and then fusing the remaining two Majorana on one edge. The result of such an operation could be the detection of an electron in half the cases. A control experiment could be carried out on similar timescales, by fusing one pair close to the edge at which it is created and then moving and fusing the other pair in the same location. Fusion could lead to a vacuum. Electrons may not be detected.

Figure 5:
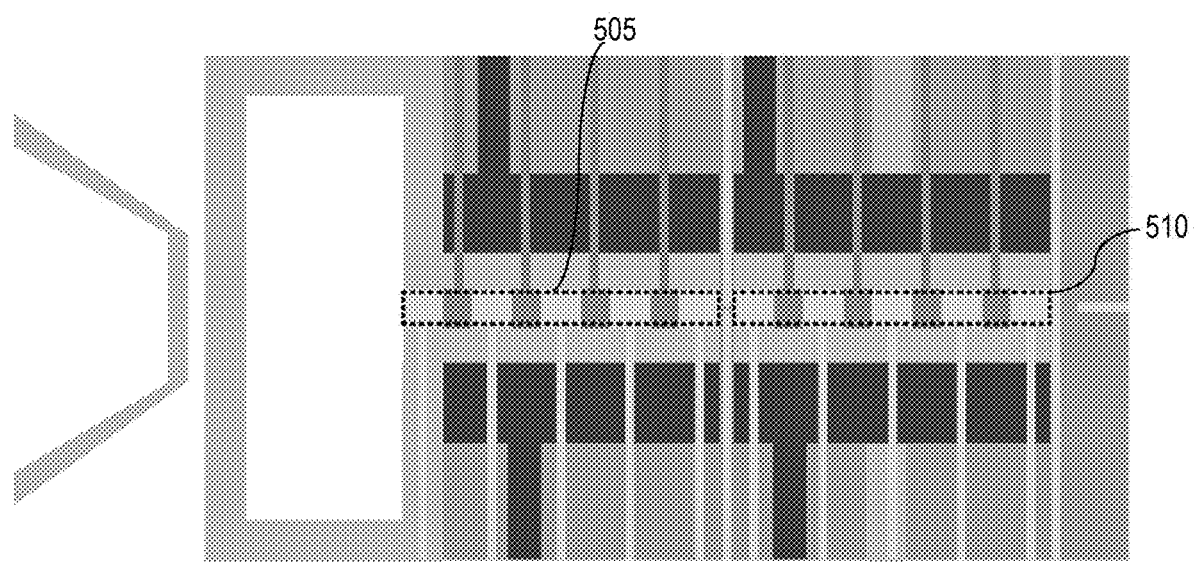
FIG. 5 illustrates a schematic diagram of a phase-controlled device including two Josephson junctions, according to an embodiment.

FIG. 5 illustrates a schematic diagram of a phase-controlled device including two Josephson junctions (e.g., a first Josephson junction 505 and a second Josephson junction 510). A different architecture taking advantage of the possibility to phase-bias a Josephson junction is shown. The device can include two Josephson junctions fabricated next to one another. The device can include two Josephson junctions coupled through a QPC in which one Josephson junction can be phase-biased using a superconducting loop and a flux line. A QPC can allow for the tuning of the interaction between the weak links of both Josephson junctions. The junction on the right is electrically connected, allowing for the measurement of its critical current, for example, and has a charge sensor on its right. The Josephson junction on the left is shunted by a superconducting loop and a nearby bias line allows for the tuning of the Josephson junction phase by driving a current through it. Non-topologically protected operations can be performed in the previous device by inducing a coupling between the topological sections in each Josephson junction through gate voltage. The gate voltage can be applied on the middle QPC. The phase control can be implemented on half the device.

Figure 6A:
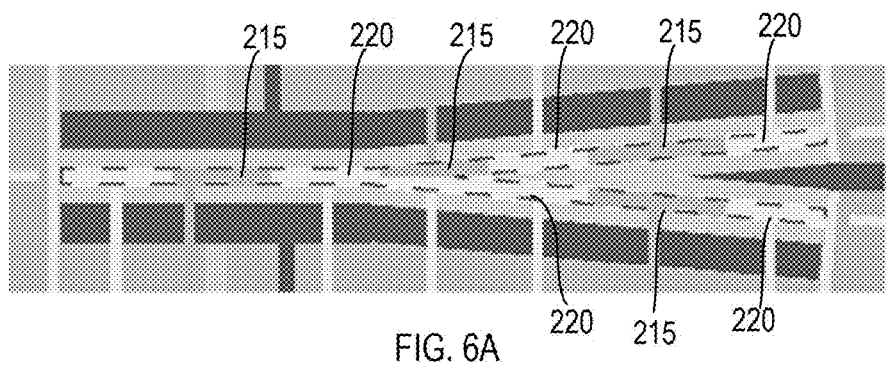
FIGS. 6A-6F illustrate a schematic diagram of a Y-junction to implement braiding operations, according to an embodiment.

FIGS. 6A-6F illustrate a schematic diagram of a Y-junction to implement braiding operations. FIG. 6A illustrates the overall geometry which features a Josephson junction with three contacts arranged in a Y-shape. One charge sensor is included at each end of the Y. The middle section of the Y can include adding an extra step of gate deposition. FIGS. 6B-6F illustrate a braiding procedure using gate voltage. The bright regions indicates regions in which the device is tuned in the topological regime. The Majorana fermion location is indicated by stars. The gate voltages are tuned to extend and contract the topological domain. The full procedure can result in the exchange of the two pairs of Majoranas.

The device can be capable of performing braiding by using the gate tunability of the device. A Y-shape with a small angle (e.g., 10°) between the two branches of the Y is illustrated in FIG. 6A. The topological phase can persist in the presence of small misalignment. An alternative to this geometry would be to use a tuning fork to preserve the alignment with field in all branches except in the middle region.

Figure 6B:
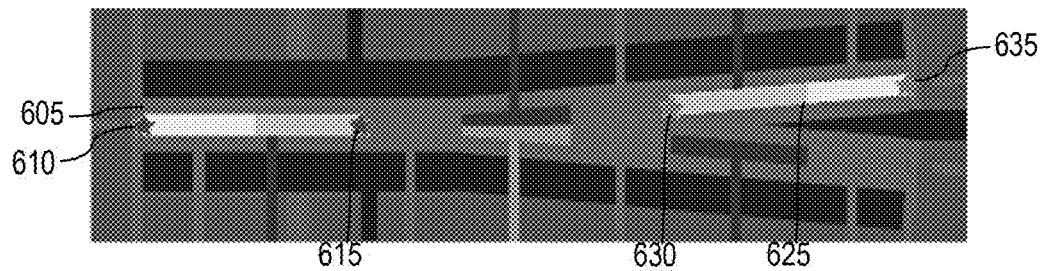
Figure 6C:
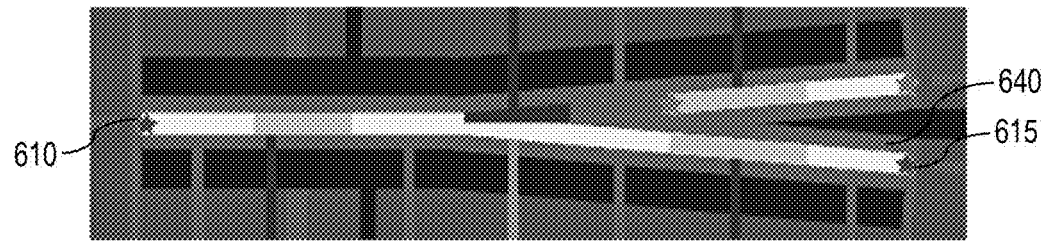
Figure 6D:
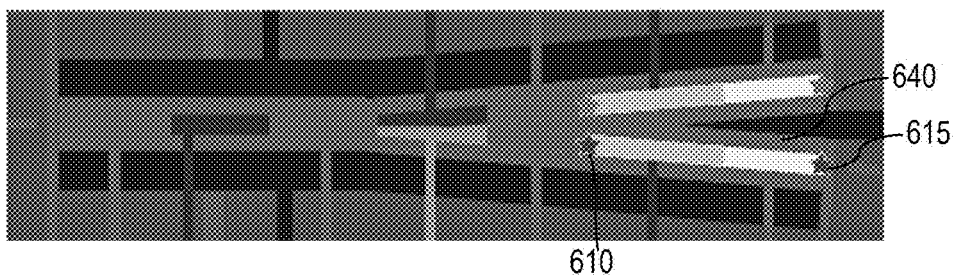
Figure 6E:
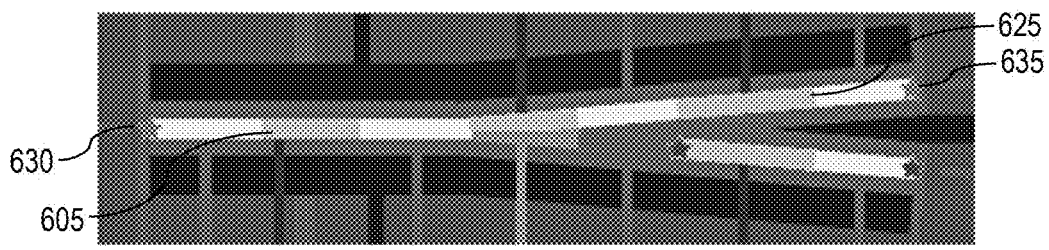
Figure 6F:
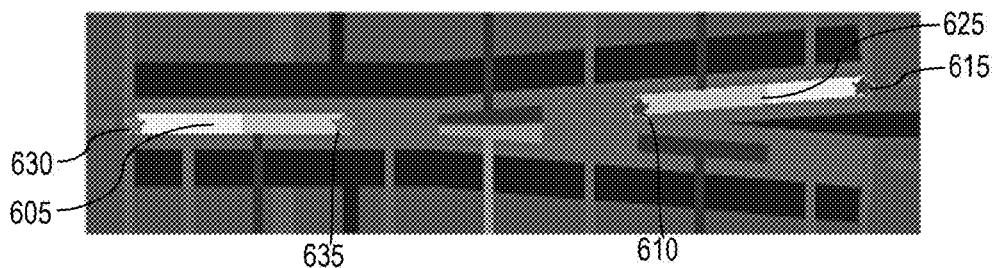

To perform braiding, the gates are first tuned to have two separate topological region each hosting a pair of Majorana. This is illustrated in FIG. 6B where the bright regions indicate gates tuned to be in the topological regime and stars indicate the location of the Majorana fermions. The topological region in the left arm is first extended into the lower right arm of the Y and then contracted to reside only in the lower right arm. The presence of the depletion between the two arms prevent spurious interaction between the topological regions as soon as the arm of the Y are long enough. Once that first move is completed, the region in the top right region is moved to the left arm in a similar manner. The braiding operation is completed by moving the topological region in the lower right arm to the upper right arm. The result of the operation can be read out through fusion using the charge sensors located at the end of each arm. The procedure can be used to exchange two pairs of Majorana. The same geometry can be used to exchange two Majorana of a single pair when the device hosts a single pair of Majorana.

A method of performing braiding operations can include providing a Josephson junction. The Josephson junction can include gates. The gates can include a first set of tuning gates (e.g., first set of gates 215) and a second set of tuning gates (e.g., second set of gates 220). The method can include tuning the gates to dispose a first pair of Majorana fermions in a first region 605. The first pair of Majorana fermions can include a first Majorana fermion 610 and a second Majorana fermion 615.

The method can include tuning the gates to dispose a second pair of Majorana fermions in a second region 625. The second pair of Majorana fermions can include a third Majorana fermion 630 and a fourth Majorana fermion 635. Tuning the gates to dispose the second pair of Majorana fermions in the second region 625 can occur subsequent to tuning the gates to dispose the first pair of Majorana fermions in the first region 605. Tuning the gates to dispose the second pair of Majorana fermions in the second region 625 can occur prior to tuning the gates to dispose the first pair of Majorana fermions in the first region 605.

The method can include tuning the gates to dispose the first Majorana fermion 610 in the first region 605 and to dispose the second Majorana fermion 615 in a third region 640. Tuning the gates to dispose the first Majorana fermion 610 in the first region 605 and to dispose the second Majorana fermion 615 in the third region 640 can occur subsequent to tuning the gates to dispose the second pair of Majorana fermions in the second region 625. Tuning the gates to dispose the first Majorana fermion 610 in the first region 605 and to dispose the second Majorana fermion 615 in the third region 640 can occur subsequent to tuning the gates to dispose the first pair of Majorana fermions in the first region 605.

The method can include tuning the gates to dispose the first Majorana fermion 610 in the third region 640 and to dispose the second Majorana fermion 615 in the third region 640. Tuning the gates to dispose the first Majorana fermion 610 in the third region 640 and to dispose the second Majorana fermion 615 in the third region 640 can occur subsequent to tuning the gates to dispose the first Majorana fermion 610 in the first region 605 and to dispose the second Majorana fermion 615 in the third region 640. Tuning the gates to dispose the first Majorana fermion 610 in the third region 640 and to dispose the second Majorana fermion 615 in the third region 640 can occur subsequent to tuning the gates to dispose the second pair of Majorana fermions in the second region 625. Tuning the gates to dispose the first Majorana fermion 610 in the third region 640 and to dispose the second Majorana fermion 615 in the third region 640 can occur subsequent to tuning the gates to dispose the first pair of Majorana fermions in the first region 605.

The method can include tuning the gates to dispose the third Majorana fermion 630 in the first region 605 and to dispose the fourth Majorana fermion 635 in the second region 625. Tuning the gates to dispose the third Majorana fermion 630 in the first region 605 and to dispose the fourth Majorana fermion 635 in the second region 625 can occur subsequent to tuning the gates to dispose the first Majorana fermion 610 in the third region 640 and to dispose the second Majorana fermion 615 in the third region 640. Tuning the gates to dispose the third Majorana fermion 630 in the first region 605 and to dispose the fourth Majorana fermion 635 in the second region 625 can occur subsequent to tuning the gates to dispose the first Majorana fermion 610 in the first region 605 and to dispose the second Majorana fermion 615 in the third region 640. Tuning the gates to dispose the third Majorana fermion 630 in the first region 605 and to dispose the fourth Majorana fermion 635 in the second region 625 can occur subsequent to tuning the gates to dispose the second pair of Majorana fermions in the second region 625. Tuning the gates to dispose the third Majorana fermion 630 in the first region 605 and to dispose the fourth Majorana fermion 635 in the second region 625 can occur subsequent to tuning the gates to dispose the first pair of Majorana fermions in the first region 605.

The method can include tuning the gates to dispose the third Majorana fermion 630 in the first region 605 and to dispose the fourth Majorana fermion 635 in the first region 605. Tuning the gates to dispose the third Majorana fermion 630 in the first region 605 and to dispose the fourth Majorana fermion 635 in the first region 605 can occur subsequent to tuning the gates to dispose the third Majorana fermion 630 in the first region 605 and to dispose the fourth Majorana fermion 635 in the second region 625. Tuning the gates to dispose the third Majorana fermion 630 in the first region 605 and to dispose the fourth Majorana fermion 635 in the first region 605 can occur subsequent to tuning the gates to dispose the first Majorana fermion 610 in the third region 640 and to dispose the second Majorana fermion 615 in the third region 640. Tuning the gates to dispose the third Majorana fermion 630 in the first region 605 and to dispose the fourth Majorana fermion 635 in the first region 605 can occur subsequent to tuning the gates to dispose the first Majorana fermion 610 in the first region 605 and to dispose the second Majorana fermion 615 in the third region 640. Tuning the gates to dispose the third Majorana fermion 630 in the first region 605 and to dispose the fourth Majorana fermion 635 in the first region 605 can occur subsequent to tuning the gates to dispose the second pair of Majorana fermions in the second region 625. Tuning the gates to dispose the third Majorana fermion 630 in the first region 605 and to dispose the fourth Majorana fermion 635 in the first region 605 can occur subsequent to tuning the gates to dispose the first pair of Majorana fermions in the first region 605.

The method can include tuning the gates to dispose the first Majorana fermion 610 in the second region 625 and to dispose the second Majorana fermion 615 in the second region 625. Tuning the gates to dispose the first Majorana fermion 610 in the second region 625 and to dispose the second Majorana fermion 615 in the second region 625 can occur subsequent to tuning the gates to dispose the third Majorana fermion 630 in the first region 605 and to dispose the fourth Majorana fermion 635 in the first region 605. Tuning the gates to dispose the first Majorana fermion 610 in the second region 625 and to dispose the second Majorana fermion 615 in the second region 625 can occur subsequent to tuning the gates to dispose the third Majorana fermion 630 in the first region 605 and to dispose the fourth Majorana fermion 635 in the second region 625. Tuning the gates to dispose the first Majorana fermion 610 in the second region 625 and to dispose the second Majorana fermion 615 in the second region 625 can occur subsequent to tuning the gates to dispose the first Majorana fermion 610 in the third region 640 and to dispose the second Majorana fermion 615 in the third region 640. Tuning the gates to dispose the first Majorana fermion 610 in the second region 625 and to dispose the second Majorana fermion 615 in the second region 625 can occur subsequent to tuning the gates to dispose the first Majorana fermion 610 in the first region 605 and to dispose the second Majorana fermion 615 in the third region 640. Tuning the gates to dispose the first Majorana fermion 610 in the second region 625 and to dispose the second Majorana fermion 615 in the second region 625 can occur subsequent to tuning the gates to dispose the second pair of Majorana fermions in the second region 625. Tuning the gates to dispose the first Majorana fermion 610 in the second region 625 and to dispose the second Majorana fermion 615 in the second region 625 can occur subsequent to tuning the gates to dispose the first pair of Majorana fermions in the first region 605.

Figure 7A:
Figure 7B:
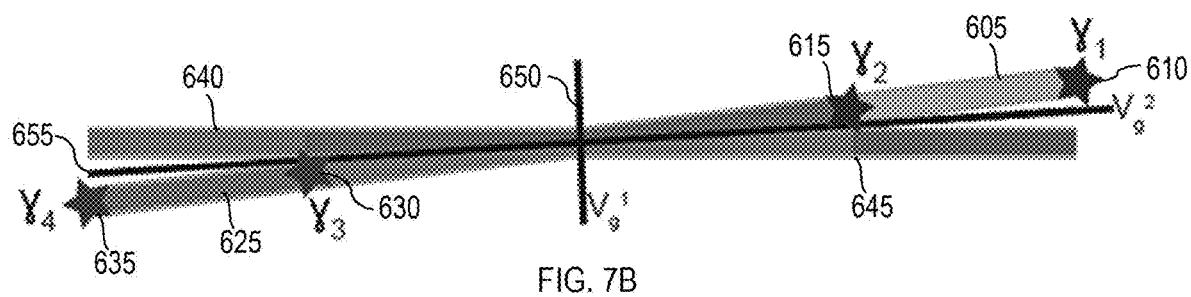
Figure 7C:
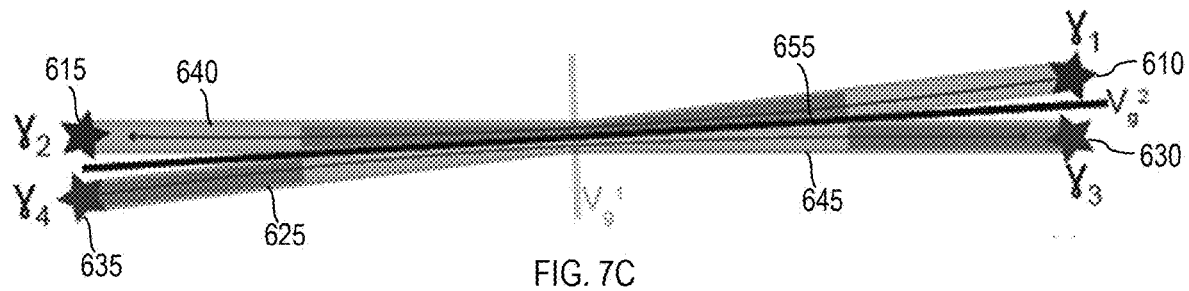
Figure 7D:
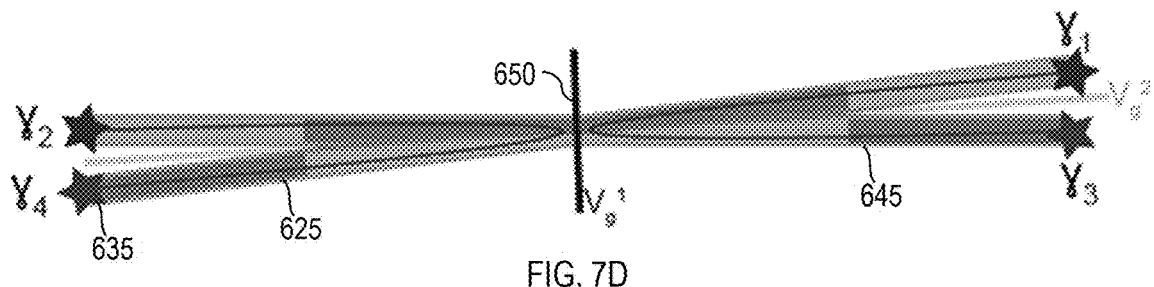

FIGS. 7A-7E illustrate an extensible design allowing for arbitrary braids. FIG. 7A illustrates a braiding operation consisting of exchanging two Majorana belonging to different pairs. FIG. 7B illustrates an X junction whose crossing region can be divided in two using narrow "splitter" gates ($V_g^{-1}$ and $V_g^2$) when they deplete the area beneath and in gray otherwise. The depletion gates behind the superconducting contacts have been omitted and the connections of the different gates have also been omitted. FIGS. 7C and 7D illustrate steps to realize the braid described in FIG. 7A. FIG. 7E illustrates a design combining two X junction as described above and adding charge detectors (hexagons) at the end of each open section. Such a design can be extended by adding extra X at the end of any section.

Braiding Majorana belonging to different pairs, as depicted in FIG. 7A, can include cutting and gluing back together different topological regions. The architecture can be more resilient than the T-junction by performing the operation with all the Majoranas involved far from the location of the local manipulation. FIG. 7B illustrates two Josephson junctions forming an X. The gates allowing for the turning of a portion of the device in and out of the topological regime are shown. This device comports two additional "splitter" gates allowing for the isolation of the top branches of the X from the bottom branches of the left from the right branches. To perform the braid described in FIG. 7A, starting from FIG. 7B, $V_g^{-1}$ would first be set to a value allowing for the connection of the left and right parts and $\gamma_2$ and $\gamma_3$ would be moved: $\gamma_2$ to the top left and $\gamma_3$ to the bottom right as illustrated in FIG. 7C. The value of the two "splitter" gates would then be inverted, leading to connecting $\gamma_1$ to $\gamma_3$ and $\gamma_2$ to $\gamma_4$ as shown in FIG. 7D. The gates depicted could then be used to bring $\gamma_2$ in the original position of $\gamma_3$ and respectively completing the braid. One advantage of this architecture is that the manipulation of the "splitter" gates is performed while the Majoranas are all far away from the middle junction hence minimizing its possible impact on their state. Furthermore such elements can be assembled, as depicted in FIG. 7E for two elements, to form more complex network. Charge sensing devices, shown as hexagons in FIG. 7E, can be placed at the extremity of each open end.

A method performing braiding operations can include providing a first Josephson junction. The first Josephson junction can include first gates. The first gates can include a first set of tuning gates and a second set of tuning gates. The method can include providing a second Josephson junction. The second Josephson junction can include second gates. The second gates can include a third set of tuning gates and a fourth set of tuning gates.

The method can include tuning the first gates to dispose a first pair of Majorana fermions in the first region 605. The first pair of Majorana fermions can include a first Majorana fermion 610 and a second Majorana fermion 615.

The method can include tuning the second gates to dispose a second pair of Majorana fermions in a second region 625. The second pair of Majorana fermions can include a third Majorana fermion 630 and a fourth Majorana fermion 635. Tuning the second gates to dispose the second pair of Majorana fermions in the second region 625 can occur subsequent to tuning the first gates to dispose the first pair of Majorana fermions in the first region 605.

The method can include tuning the first gates to dispose the first Majorana fermion 610 in the first region 605 and to dispose the second Majorana fermion 615 in a third region 640. Tuning the first gates to dispose the first Majorana fermion 610 in the first region 605 and to dispose the second Majorana fermion 615 in a third region 640 can occur subsequent to tuning the second gates to dispose the second pair of Majorana fermions in the second region 625. Tuning the first gates to dispose the first Majorana fermion 610 in the first region 605 and to dispose the second Majorana fermion 615 in a third region 640 can occur subsequent to tuning the first gates to dispose the first pair of Majorana fermions in the first region 605.

The method can include tuning the second gates to dispose the third Majorana fermion 630 in a fourth region 645 and to dispose the fourth Majorana fermion 635 in the second region 625. Tuning the second gates to dispose the third Majorana fermion 630 in the fourth region 645 and to dispose the fourth Majorana fermion 635 in the second region 625 can occur subsequent to tuning the first gates to dispose the first Majorana fermion 610 in the first region 605 and to dispose the second Majorana fermion 615 in a third region 640. Tuning the second gates to dispose the third Majorana fermion 630 in the fourth region 645 and to dispose the fourth Majorana fermion 635 in the second region 625 can occur subsequent to tuning the second gates to dispose the second pair of Majorana fermions in the second region 625. Tuning the second gates to dispose the third Majorana fermion 630 in the fourth region 645 and to dispose the fourth Majorana fermion 635 in the second region 625 can occur subsequent to tuning the first gates to dispose the first pair of Majorana fermions in the first region 605.

The method can include providing a first splitter gate 650 configured to isolate the first region 605 and the fourth region 645 from the second region 625 and the third region 640. The method can include providing a second splitter gate 655 configured to isolate the first region 605 and the third region 640 from the second region 625 and the fourth region 645.

FIGS. 8A-8B illustrate a demonstration of a CNOT (controlled NOT) gate on two qubits. The device be used to perform a CNOT gate on two qubits encoded on six Majorana fermions by braiding as illustrated in FIG. 8A. FIG. 8A illustrates a braid implementing a CNOT gate for two qubits encoded on six Majorana fermions. FIG. 8B illustrates the initial state of the device presented in FIG. 7E to perform the braid described in FIG. 8A. The positions at which the Majorana can be stored are labeled from a (a') to f (f') for the extremities. The middle position is labelled m. FIG. 8B introduces labels for the position at which the Majoranas can be placed. Those labels are used in FIG. 9 to describe the details of the braiding procedure realized in FIG. 8A.

FIG. 9 illustrates a table of locations of the Majorana fermions as a function of time and state of the splitter gates. Locations of the Majorana fermions as a function of time and state of the splitter gates in the right X during the braiding protocol illustrated in FIG. 8A. The locations correspond to the labels introduced in FIG. 8B. The movement of the Majorana fermions can be achieved through proper tuning of the gates covering the different portions of the device. The splitter can be either opened (o) meaning that the 2DEG below is not depleted or shut (s) in which case the 2DEG is strongly depleted. At each time the location or gate state that was modified is emphasized in bold (and also circled).

The devices of the present disclosure provides different capabilities to build a quantum information processing platform based on Majorana fermions in Josephson junctions. Majorana fermions can be used to implement two Clifford gates through braiding. Charge interaction or phase manipulation can be engineered using the X geometry. The Y-geometry can have a lower complexity than the X geometry.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above.

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

What is claimed is:

1. A method, comprising:
  providing a stack, the stack comprising:
    a substrate;
    a two-dimensional electron gas layer disposed on the substrate; and
    a superconducting layer disposed on the two-dimensional electron gas layer;
  etching the stack;
  removing a portion of the superconducting layer to form a weak link region;
  depositing a first dielectric layer on the stack;
  depositing a first gate electrode on a first portion of the first dielectric layer, the first gate electrode configured to deplete charge carriers from a first portion of the two-dimensional electron gas layer; and
  depositing a second gate electrode on a second portion of the first dielectric layer, the second gate electrode configured to deplete charge carriers from a second portion of the two-dimensional electron gas layer.

2. The method of claim 1, further comprising:
  depositing a second dielectric layer on the stack.

3. The method of claim 2, further comprising:
  depositing a third gate electrode on the stack, the third gate electrode configured to overlap with the first gate electrode.

4. The method of claim 1, wherein etching the stack comprises wet etching.

5. The method of claim 1, wherein the first dielectric layer is deposited via atomic layer deposition.

6. The method of claim 1, wherein the two-dimensional electron gas layer comprises InAs.

7. A device, comprising:
  a substrate;
  a two-dimensional electron gas layer comprising a two-dimensional electron gas, the two-dimensional electron gas layer disposed on the substrate;
  a first superconducting electrode and a second superconducting electrode disposed on the two-dimensional electron gas layer and separated by the two-dimensional electron gas;
  a first confinement gate disposed on the first superconducting electrode and the two-dimensional electron gas layer;
  a second confinement gate disposed on the second superconducting electrode and the two-dimensional electron gas layer;
  a first set of tuning gates disposed on a weak link region between the first superconducting electrode and the second superconducting electrode; and
  a second set of tuning gates disposed on the weak link region and the second set of tuning gates.

8. The device of claim 7, wherein the weak link region is less than 100 nanometers.

9. The device of claim 7, wherein the two-dimensional electron gas comprises InAs.

* * * * *